United States Patent
Liu

(10) Patent No.: US 9,570,633 B2
(45) Date of Patent: Feb. 14, 2017

(54) SEMICONDUCTOR PACKAGE AND MANUFACTURING METHOD THEREOF

(71) Applicant: XINTEC INC., Zhongli, Taoyuan County (TW)

(72) Inventor: Chien-Hung Liu, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/570,949

(22) Filed: Dec. 15, 2014

(65) Prior Publication Data

US 2016/0118506 A1   Apr. 28, 2016

(30) Foreign Application Priority Data

Oct. 22, 2014  (TW) .............................. 103136492 A

(51) Int. Cl.

| | |
|---|---|
| *H01L 31/0203* | (2014.01) |
| *H01L 31/18* | (2006.01) |
| *H01L 31/02* | (2006.01) |
| *H01L 35/34* | (2006.01) |
| *H01L 35/02* | (2006.01) |
| *H01L 23/31* | (2006.01) |
| *H01L 23/498* | (2006.01) |
| *H01L 23/053* | (2006.01) |
| *H01L 23/00* | (2006.01) |

(52) U.S. Cl.
CPC ....... *H01L 31/0203* (2013.01); *H01L 23/3178* (2013.01); *H01L 23/3185* (2013.01); *H01L 23/498* (2013.01); *H01L 24/33* (2013.01); *H01L 31/02005* (2013.01); *H01L 31/1876* (2013.01); *H01L 35/02* (2013.01); *H01L 35/34* (2013.01); *H01L 23/053* (2013.01); *H01L 24/94* (2013.01); *H01L 2224/11* (2013.01)

(58) Field of Classification Search
None
See application file for complete search history.

(56) References Cited

U.S. PATENT DOCUMENTS

| | | | | |
|---|---|---|---|---|
| 4,802,952 | A * | 2/1989 | Kobori | .................. G01L 9/0042 |
| | | | | 156/272.2 |
| 9,177,905 | B2 * | 11/2015 | Huang | .................. H01L 23/481 |
| 2001/0018236 | A1 | 8/2001 | Badehi | |
| 2004/0214380 | A1 | 10/2004 | Leib et al. | |

(Continued)

FOREIGN PATENT DOCUMENTS

| | | |
|---|---|---|
| TW | 201027641 | 7/2010 |
| TW | 201413905 | 4/2014 |

*Primary Examiner* — Andres Munoz
(74) *Attorney, Agent, or Firm* — Liu & Liu

(57) ABSTRACT

A semiconductor package includes a substrate, at least one support, a cover, and a plate. The substrate has at least one light sensor or thermal sensor, a first surface, and a second surface opposite to the first surface. The light sensor or the thermal sensor is disposed on the first surface. The second surface has an opening to expose the light sensor (or the thermal sensor). The support is disposed on the first surface. The cover is disposed on the support, such that the cover is above the light sensor (or the thermal sensor) to form a first space between the cover and the light sensor (or the thermal sensor). The plate is placed on the second surface to cover the opening, such that a second space is formed between the plate and the light sensor (or the thermal sensor).

26 Claims, 9 Drawing Sheets

(56) References Cited

U.S. PATENT DOCUMENTS

| | | | |
|---|---|---|---|
| 2009/0050995 A1* | 2/2009 | Liu | H01L 23/3114 257/434 |
| 2009/0050996 A1* | 2/2009 | Liu | H01L 23/3114 257/434 |
| 2010/0171189 A1* | 7/2010 | Liu | B81C 1/00301 257/417 |
| 2013/0130444 A1* | 5/2013 | Liu | H01L 23/3128 438/113 |

* cited by examiner

SEMICONDUCTOR PACKAGE AND MANUFACTURING METHOD THEREOF

RELATED APPLICATIONS

This application claims priority to Taiwan Application Serial Number 103136492, filed Oct. 22, 2014, which is herein incorporated by reference.

BACKGROUND

Field of Invention

The present invention relates to a semiconductor package and a manufacturing method of the semiconductor package. More particularly, the present invention relates to a semiconductor package having a detecting function and a manufacturing method of the semiconductor package.

Description of Related Art

Along with the progress and development in electronic industry, the requirement for functions of electronic products is increased. In order to achieve the requirement of multiple functions for users, semiconductor packages and electronic components having multiple functions need to be disposed on the printed circuit boards of the electronic products. According to the requirements of miniaturization, semiconductor packages are integrated with the electronic products to form micro-electro mechanical systems (MEMS) utilizing the improvement of integration. As a result, not only the layout space of the printed circuit board may be reduced, but also the requirement of multiple functions may be maintained.

Recently, technology for stacking wafers is a new development in the art, such that plural homogeneous or heterogeneous wafers may be stacked in the development to reach the purpose of multiple functions. Therefore, the bottleneck of miniaturization in the technology of semiconductor flat package may be solved. That is to say, the requirement of miniaturization may be achieved by integration.

A detecting type semiconductor package 1 is shown in FIG. 1. The semiconductor package 1 has a chip 10 and a glass sheet 12 that is stacked on the chip 10. The chip 10 has an operating surface 10a and a non-operating surface 10b. The operating surface 10a has a light sensor 100, and the glass sheet 12 is disposed on the operating surface 10a by a dam layer 11, such that a space P is formed between the glass sheet 12 and the light sensor 100.

However, in the conventional semiconductor package 1 having a detecting function, the volume of the chip 10 is large, so that noise is more apt to occur. As a result, the use of the semiconductor package 1 is limited, and the semiconductor package 1 is difficult to be matched with the requirement of multiple functions, thereby reducing product competitiveness.

SUMMARY

An aspect of the present invention is to provide a semiconductor package.

According to an embodiment of the present invention, a semiconductor package includes a substrate, at least one support, a cover, and a plate. The substrate has at least one light sensor or thermal sensor, a first surface, and a second surface opposite to the first surface. The light sensor or the thermal sensor is disposed on the first surface. The second surface of the substrate has an opening to expose the light sensor or the thermal sensor. The support is disposed on the first surface of the substrate. The cover is disposed on the support, such that the cover is above the light sensor or the thermal sensor, and a first space is formed between the cover and the light sensor or between the cover and the thermal sensor. The plate is placed on the second surface of the substrate to cover the opening, such that a second space is formed between the plate and the light sensor or between the plate and the thermal sensor.

An aspect of the present invention is to provide a manufacturing method of a semiconductor package.

According to an embodiment of the present invention, a manufacturing method of a semiconductor package includes the following steps. A wafer that has at least one light sensor or thermal sensor, a first surface, and a second surface opposite to the first surface is provided, and the light sensor or the thermal sensor is disposed on the first surface. A cover is disposed on the first surface of the wafer by at least one support, such that the cover is above the light sensor or the thermal sensor, and a first space is formed between the cover and the light sensor or between the cover and the thermal sensor. An opening is formed in the second surface of the wafer to expose the light sensor or the thermal sensor. A plate is placed on the second surface of the substrate to cover the opening, such that a second space is formed between the plate and the light sensor or between the plate and the thermal sensor.

In the aforementioned embodiments of the present invention, since the second surface of the substrate of the semiconductor package of the present invention has the opening, the second space may be formed between the plate and the light sensor or between the plate and the thermal sensor. As a result, the volume of the substrate of the semiconductor package may be reduced, so that signal noise can be decreased, and the detecting capability of the light sensor or the thermal sensor (e.g., infrared ray detecting capability) is improved. Therefore, the use of the semiconductor package of the present invention is expanded and the purpose of multiple functions is achieved, thereby improving product competitiveness.

An aspect of the present invention is to provide a semiconductor package.

According to an embodiment of the present invention, a semiconductor package includes a substrate, at least one support, a cover, an isolation layer, and a redistribution layer. The substrate has at least one light sensor or thermal sensor, a first surface, and a second surface opposite to the first surface. The first surface has a recess and an electrical connecting pad. The light sensor or the thermal sensor is disposed on the first surface and covers the recess. The support is disposed on the first surface of the substrate. The cover is located on the support, such that a space is formed between the cover and the light sensor or between the cover and the thermal sensor. The isolation layer is located on the second surface of the substrate. The redistribution layer is located on the isolation layer and electrically connected to the electrical connecting pad.

An aspect of the present invention is to provide a manufacturing method of a semiconductor package.

According to an embodiment of the present invention, a manufacturing method of a semiconductor package includes the following steps. A wafer that has at least one light sensor or thermal sensor, a first surface, and a second surface opposite to the first surface is provided, and the light sensor or the thermal sensor is disposed on the first surface and covers a recess of the first surface. A cover is disposed on the first surface of the wafer by at least one support, such that the cover is above the light sensor or the thermal sensor, and a space is formed between the cover and the light sensor or"

between the cover and the thermal sensor. A through hole is formed in the second surface of the wafer to expose the support and an electrical connecting pad of the wafer. An isolation layer is formed on the second surface of the wafer and a wall surface that surrounds the through hole. A redistribution layer is formed on the isolation layer, and the redistribution layer is electrically connected to the electrical connecting pad.

In the aforementioned embodiments of the present invention, since the first surface of the substrate of the semiconductor package of the present invention has the recess, the volume of the substrate of the semiconductor package may be reduced. As a result, signal noise can be decreased, and the detecting capability of the light sensor or the thermal sensor (e.g., infrared ray detecting capability) is improved. Therefore, the use of the semiconductor package of the present invention is expanded and the purpose of multiple functions is achieved, thereby improving product competitiveness.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
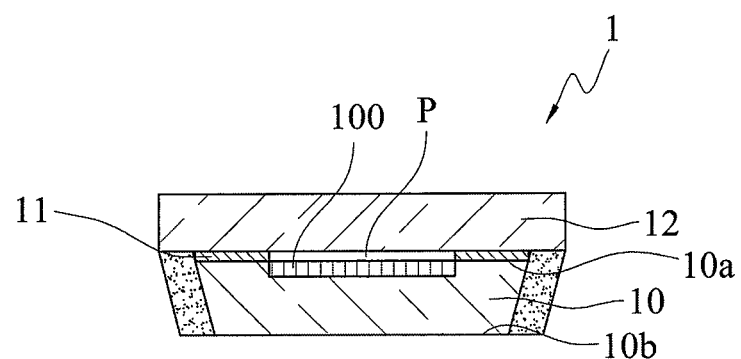
FIG. 1 is a cross-sectional view of a conventional semiconductor package.

Reference will now be made in detail to the present embodiments of the invention, examples of which are illustrated in the accompanying drawings. Wherever possible, the same reference numbers are used in the drawings and the description to refer to the same or like parts.

In the present invention, a semiconductor package after being stacked, packaged, and diced may be used in various micro electro mechanical systems (MEMS), such as an image sensor capable of detecting through an electrical variation or a capacitive variation, and a detecting-type semiconductor package manufactured in wafer scale package process (WSP) and having image sensors, RF circuits, accelerators, gyroscopes, micro actuators, or pressure sensors.

As shown in FIGS. 2A to 2J, FIGS. 2A to 2J are cross-sectional views of a manufacturing method of a semiconductor package 2 (see FIG. 2J) according to one embodiment of the present invention.

Figure 2A:
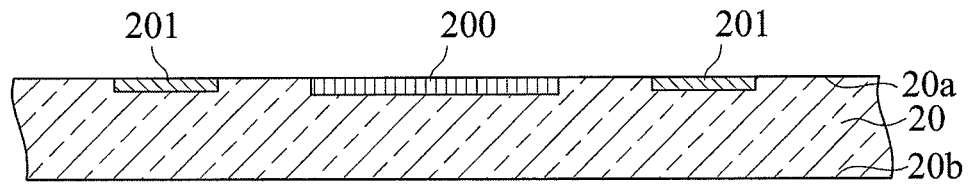
FIGS. 2A to 2J are cross-sectional views of a manufacturing method of a semiconductor package according to one embodiment of the present invention.

As shown in FIG. 2A, a wafer 20 having at least one light sensor or thermal sensor 200, a first surface 20a, and a second surface 20b opposite to the first surface 20a is provided. The light sensor or the thermal sensor 200 is disposed on the first surface 20a. For example, the light sensor or the thermal sensor 200 may be located on first surface 20a or in the first surface 20a, the light sensor or the thermal sensor 200 may protrude from the first surface 20a, the light sensor or the thermal sensor 200 and the first surface 20a may be at the same level, the light sensor or the thermal sensor 200 may be recessed in the light sensor or the thermal sensor 200, and the present invention is not limited in this regard. Moreover, the first surface 20a of the wafer 20 has a plurality of electrical connecting pads 201.

In this embodiment, the size of the wafer 20 may be 6 inches, 8 inches, 12 inches, etc., and the present invention is not limited in this regard. The light sensor or the thermal sensor 200 may be used to detect an infrared ray (IR), but the present invention is not limited thereto.

Figure 2B:
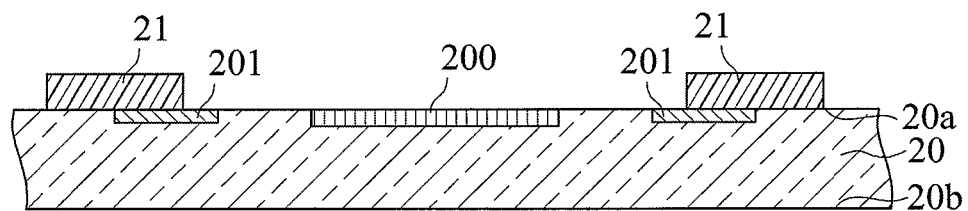

As shown in FIG. 2B, at least one support 21 is formed on the first surface 20a of the wafer 20. In this embodiment, the support 21 is a dam layer and located on a portion of a surface of the electrical connecting pad 201.

Figure 2C:
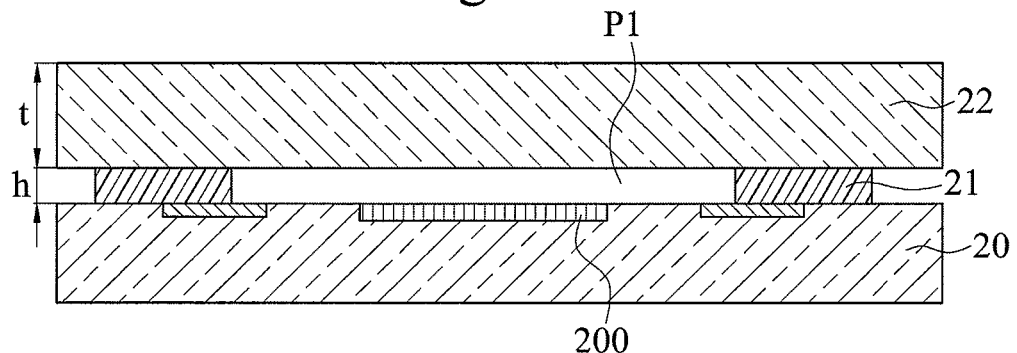

As shown in FIG. 2C, a cover 22 is disposed on the support 21, such that the cover 22 is above the light sensor or the thermal sensor 200, and a first space P1 is formed between the cover 22 and the light sensor 200 or between the cover 22 and the thermal sensor 200.

In this embodiment, the cover 22 is made of silicon or quartz, and the thickness t of the cover 22 may be 300 μm, but the thinner, the better. An infrared ray may pass through the cover 22, such that the light sensor or the thermal sensor 200 may detect the infrared ray, but the present invention is not limited to the infrared ray.

Furthermore, the first space P1 is in a vacuum state, and the height h of the first space P1 may be in a range form 30 μm to 50 μm, such as 40 μm.

In addition, the cover 22 is made of light impermeable material (e.g., silicon or quartz). Therefore, an optical alignment process may not be used. As a result, the support 21 is disposed on the first surface 20a of the wafer 20, and thereafter the cover 22 is used to cover the wafer 20, such that the alignment problem of the cover 22 (or the support 21) is prevented.

In another embodiment, when the cover 22 is made of light permeable material (e.g., glass), the support 21 may be disposed on cover 22, and next the support 21 and the cover 22 may be disposed on the first surface 20a of the wafer 20 by an alignment method, such as optical alignment by utilizing the light transmittance of glass.

Figure 2D:
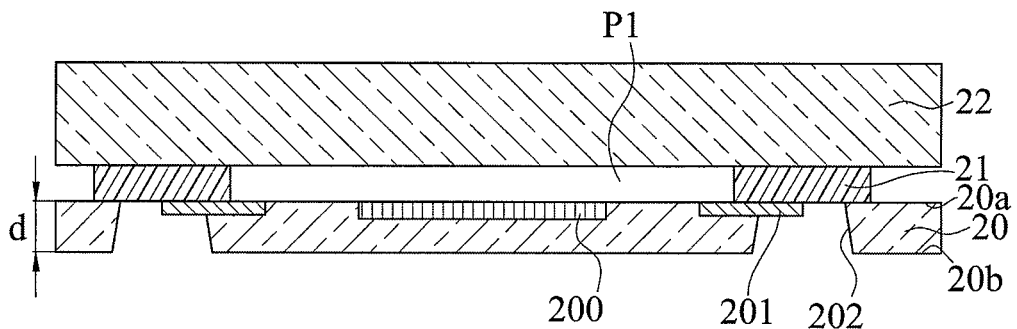

As shown in FIG. 2D, the thickness of the wafer 20 is reduced from the second surface 20b, and a through hole 202 is formed in the second surface 20b of the wafer 20 to expose the support 21 and the electrical connecting pad 201.

In this embodiment, after a process for reducing the thickness of the wafer 20 is performed, the thickness d of the wafer 20 may be in a range from 100 μm to 400 μm.

Figure 2E:
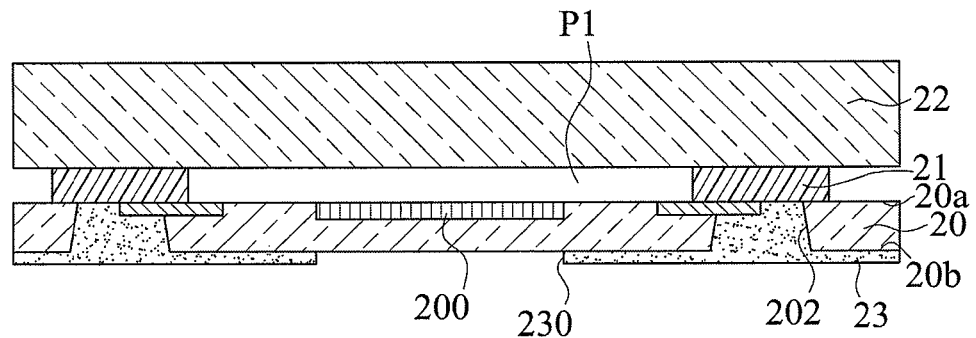

As shown in FIG. 2E, an isolation layer 23 is formed on the second surface 20b of the wafer 20, and through hole 202 is filled with the isolation layer 23. Thereafter, an opening region 230 that is aligned with the light sensor or the thermal sensor 200 on the isolation layer 23 is formed, such that a portion of the second surface 20b of the wafer 20 is exposed through the opening region 230.

Figure 2F:
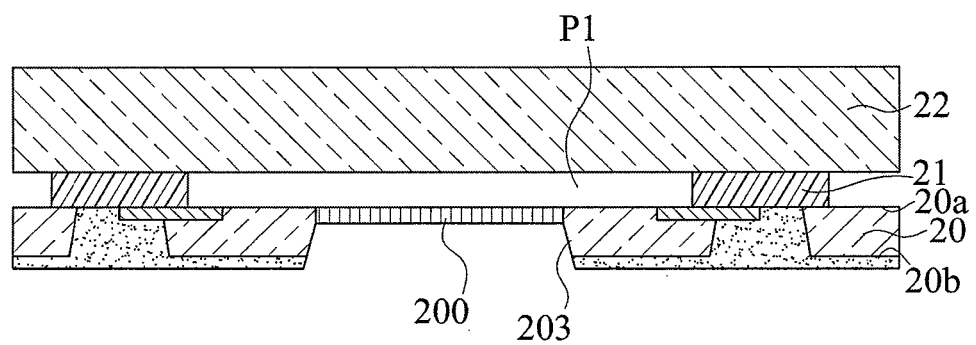

As shown in FIG. 2F, an opening 203 is formed in the second surface 20b of the wafer 20 in the opening region 230 to expose the light sensor or the thermal sensor 200. In this embodiment, the opening 203 is formed by and etching process.

Figure 2G:
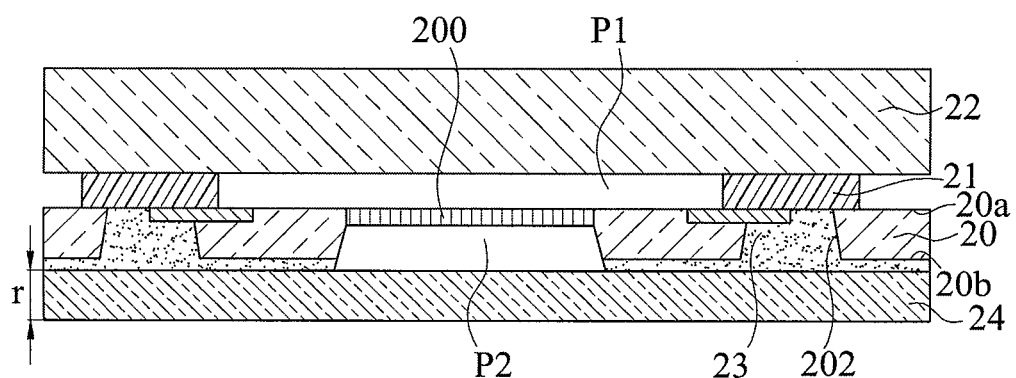

As shown in FIG. 2G, a plate 24 is placed on the second surface 20b of the wafer 20 to cover the opening 203, such that a second space P2 is formed between the plate 24 and the light sensor 200 or between the plate 24 and the thermal sensor 200. The plate 24 may support the wafer 20 to enhance structure strength.

In this embodiment, the plate 24 may be made of silicon or glass, and the plate 24 is disposed on the isolation layer 23 and the through hole 202. Moreover, the thickness r of the plate 24 may be in a range from 100 µm to 300 µm, such as 200 µm.

In addition, the second space P2 is in a vacuum state.

Figure 2H:
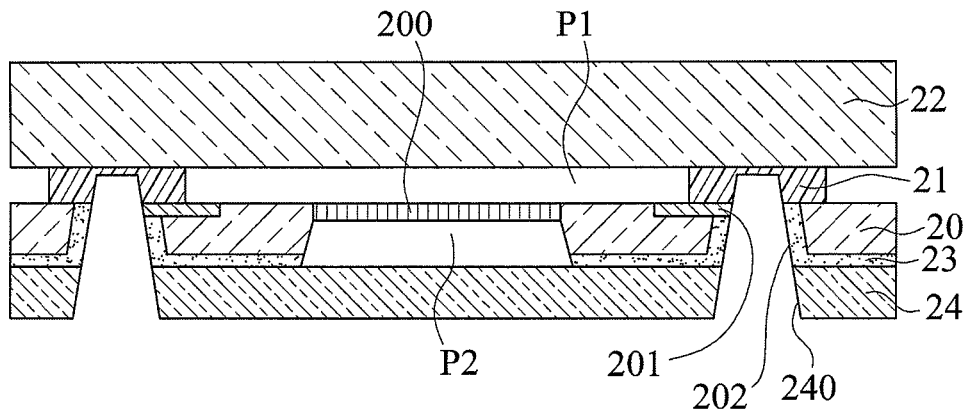

As shown in FIG. 2H, an via hole 240 communicated with the through hole 202 is formed in the plate 24, and the isolation layer 23 and the support 21 are removed from the through hole 202, such that the support 21 and a side surface of the electrical connecting pad 201.

Figure 2I:
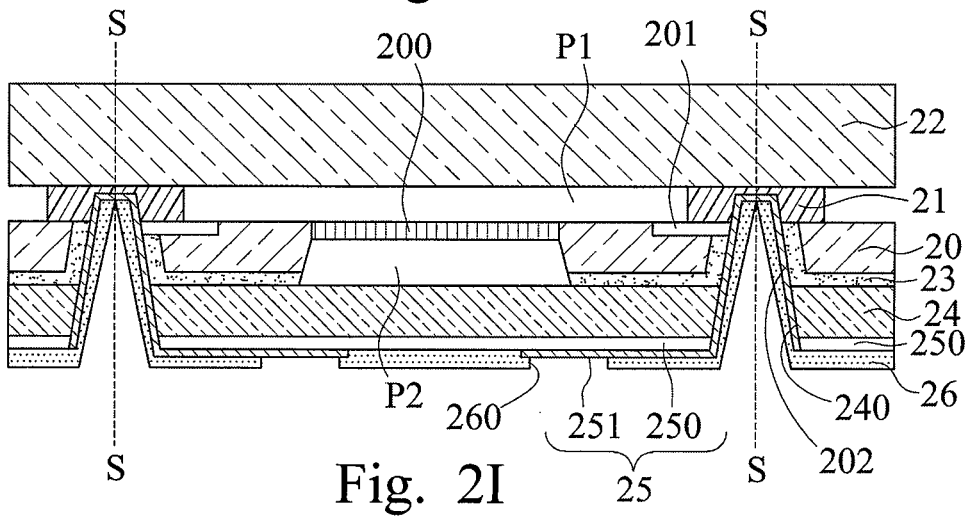

As shown in FIG. 2I, a redistribution layer 25 is formed on the plate 24, the sidewall of the via hole 240, and the sidewall of the through hole 202, such that the redistribution layer 25 is electrically connected to the electrical connecting pad 201.

In this embodiment, the redistribution layer 25 includes a dielectric layer 250 and a conductive layer 251 that is formed on the dielectric layer 250. The dielectric layer 250 is formed on the plate 24, the sidewall of the via hole 240, and the sidewall of the through hole 202.

Thereafter, a protection layer 26 is formed on the plate 24 and the redistribution layer 25, and an opening hole 260 is formed in the protection layer 26, such that a portion of a surface of the redistribution layer 251 on the plate 24 is exposed through the opening hole 260.

In this embodiment, the protection layer 26 may be made of solder mask material. A conductive protrusion 27 may be a solder ball, a protruding block, or a structure that is known in the industry, and the shape of the conductive protrusion 27 may be round, elliptical, square, and rectangular, but the present invention is not limited in this regard.

Figure 2J:
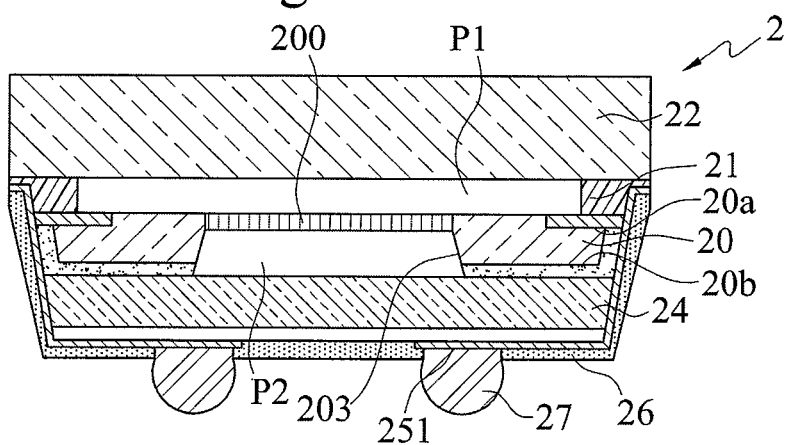

Afterwards, a dicing process is performed, and a cutting path S of the dicing process is along the through hole 202 and the via hole 240, such that a plurality of semiconductor packages shown in FIG. 2J are formed. Moreover, the conductive protrusion 27 may be formed on the redistribution layer 251 in the opening hole 260. A chip, such as a substrate 20 shown in FIG. 2J, may be referred to as the wafer 20 after being diced. The second space P2 can prevent a light signal or a thermal signal of the light sensor 200 or a light signal or a thermal signal of the thermal sensor 200 from dissipating through the substrate 20 to affect a detecting result.

Since the second surface of the substrate of the semiconductor package has the opening, the second space may be formed between the plate and the light sensor or between the plate and the thermal sensor. As a result, the volume of the substrate of the semiconductor package may be reduced, so that signal noise can be decreased, and the detecting capability of the light sensor or the thermal sensor (e.g., infrared ray detecting capability) is improved. Therefore, the use of the semiconductor package is expanded and the purpose of multiple functions is achieved, thereby improving product competitiveness.

It is to be noted that the materials of the elements described above will not be repeated in the following description. In the following description, other semiconductor packages and manufacturing methods thereof will be described.

Figure 3A:
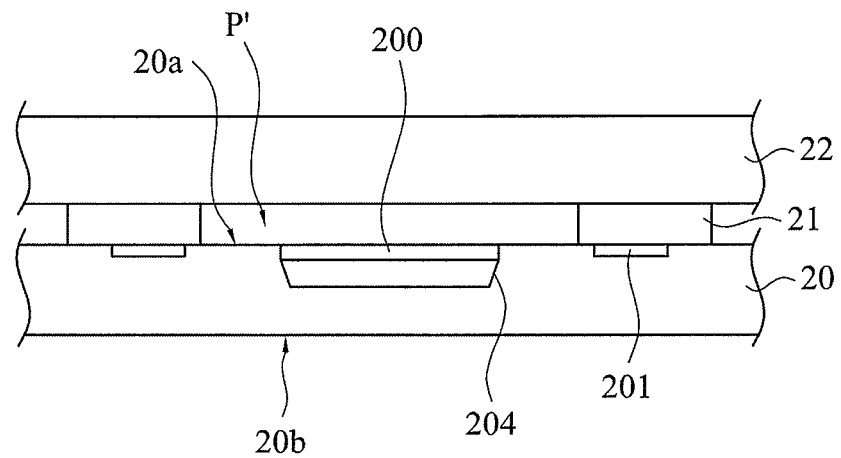
FIGS. 3A to 3E are cross-sectional views of a manufacturing method of a semiconductor package according to one embodiment of the present invention.

FIGS. 3A to 3E are cross-sectional views of a manufacturing method of a semiconductor package 3 (see FIG. 3E) according to one embodiment of the present invention. As shown in FIG. 3A, the wafer 20 that has at least one light sensor or thermal sensor 200, the first surface 20a, and the second surface 20b opposite to the first surface 20a is provided. The light sensor or the thermal sensor 200 is disposed on the first surface 20a and covers a recess 204 of the first surface 20a. The cover 22 may be disposed on the first surface 20a of the wafer 20 by at least one support 21, such that the cover 22 is above the light sensor or the thermal sensor 200, and a space P' is formed between the cover 22 and the light sensor 200 or between the cover 22 and the thermal sensor 200. Thereafter, the second surface 20b of the wafer 20 may be ground.

Figure 3B:
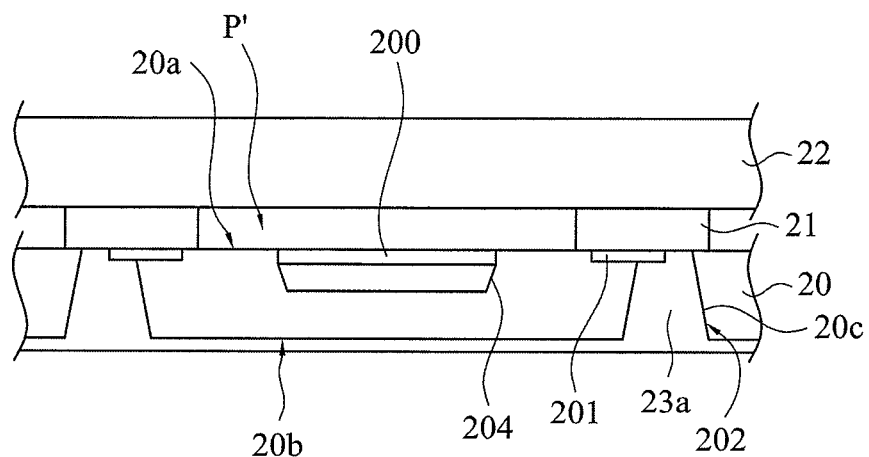

As shown in FIG. 3A and FIG. 3B, after the cover 22 covers the light sensor or the thermal sensor 200, the through hole 202 may be formed in the second surface 20b of the wafer 20 to expose the support 21 and the electrical connecting pad 201 of the wafer 20. Next, an isolation layer 23a may be formed on the second surface 20b of the wafer 20 and a wall surface 20c that surrounds the through hole 202.

Figure 3C:
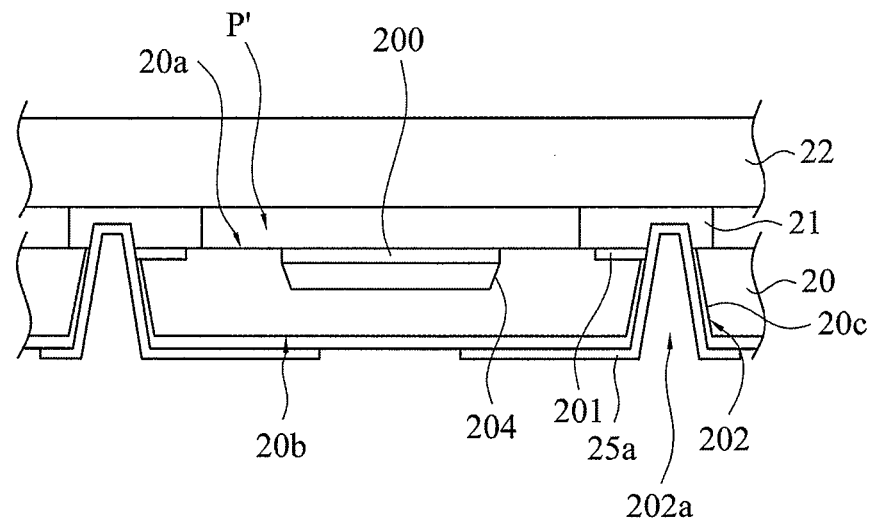

As shown in FIG. 3B and FIG. 3C, in this embodiment, the isolation layer 23a may cover the through hole 202, and a knife is used to form a notch 202a in the isolation layer 23a in the through hole 202, such that the isolation layer 23a is located on the wall surface of the wafer 20 surrounding the through hole 202. Thereafter, a redistribution layer 25a is formed on the isolation layer 23a and electrically connected to the electrical connecting pad 201, such that the structure shown in FIG. 3C may be obtained.

Figure 3D:
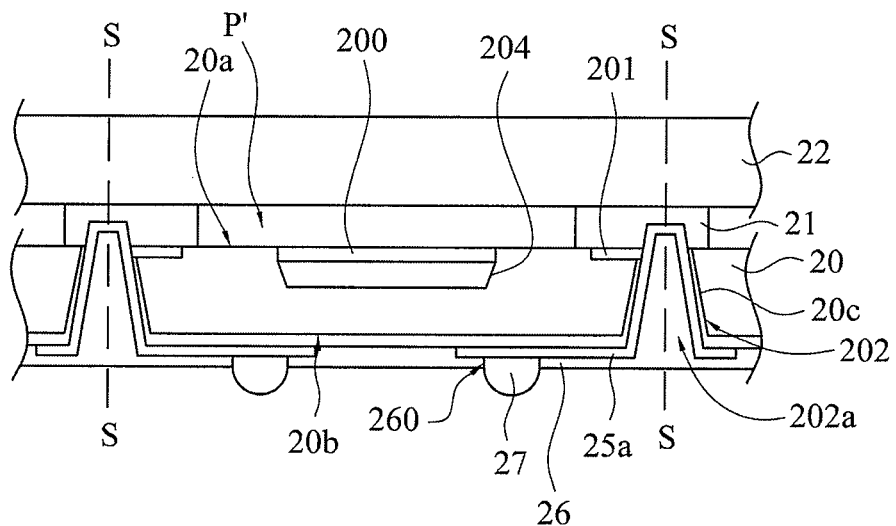

As shown in FIG. 3C and FIG. 3D, after the redistribution layer 25a is formed, the protection layer 26 may be formed on the isolation layer 23a and the redistribution layer 25a. Afterwards, the protection layer 26 is patterned to form the opening hole 260 to expose the redistribution layer 25a. After the opening hole 260 of the protection layer 26 is formed, the conductive protrusion 27 may be formed on the redistribution layer 25a in the opening hole 260, such that the conductive protrusion 27 may be conducted with the electrical connecting pad 201 through the redistribution layer 25a.

Figure 3E:
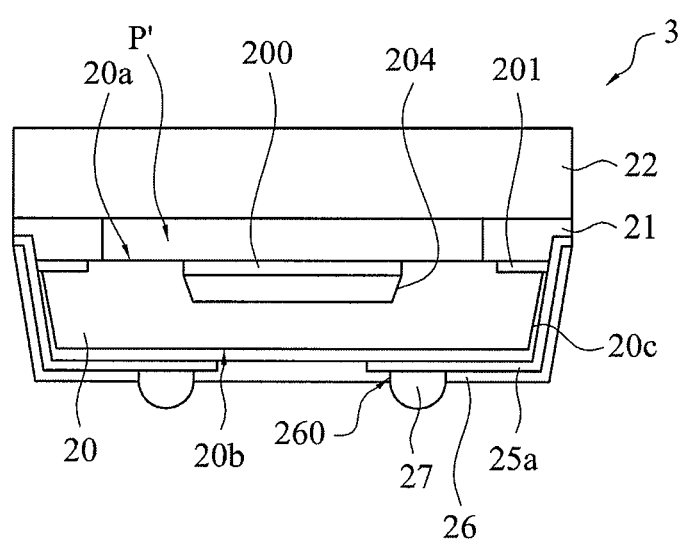

As shown in FIGS. 3D and 3E, after the structure shown in FIG. 3D is obtained, the cover 22, the support 21, and the wafer 20 may be vertically diced along the through hole 202 (i.e., along the cutting path S), such that the semiconductor package 3 is obtained. The substrate 20 shown in FIG. 3E is the diced wafer 20.

The semiconductor package 3 includes the substrate 20, at least one support 21, the cover 22, the isolation layer 23a, the redistribution layer 25a, the protection layer 26, and the conductive protrusion 27. The substrate 20 has at least one light sensor or thermal sensor 200, the first surface 20a and the second surface 20b that is opposite to the first surface 20a. The first surface 20a has the recess 204 and the electrical connecting pad 201. The recess 204 can prevent a light signal or a thermal signal of the light sensor 200 or a light signal or a thermal signal of the thermal sensor 200 from dissipating through the substrate 20 to affect a detecting result. The light sensor or the thermal sensor 200 is disposed on the first surface 20a and covers the recess 204. The support 21 is disposed on the first surface 20a of the substrate 20. The cover 22 is located on the support 21, such that the space P' is formed between the cover 22 and the light sensor 200 or between the cover 22 and the thermal sensor 200. The isolation layer 23a is located on the second surface 20b of the substrate 20. The redistribution layer 25a is located on the isolation layer 23a and electrically connected to the electrical connecting pad 201. The protection layer 26 is located on the isolation layer 23a and the redistribution layer 25a, and the protection layer 26 has the opening hole 260 to expose a portion of a surface of the redistribution layer 25a. The conductive protrusion 27 is located on the redistribution layer 25a that is in the opening hole 260.

In this embodiment, the substrate 20 has the wall surface 20c adjacent to the electrical connecting pad 201 and the second surface 20b, and the isolation layer 23a is located on the wall surface 20c. Furthermore, an obtuse angle is included between the wall surface 20c and the second surface 20b.

Since the first surface of the substrate of the semiconductor package has the recess, the volume of the substrate of the semiconductor package may be reduced. As a result, signal noise can be decreased, and the detecting capability of the light sensor or the thermal sensor (e.g., infrared ray detecting capability) is improved. Therefore, the use of the semiconductor package is expanded and the purpose of multiple functions is achieved, thereby improving product competitiveness.

Figure 4A:
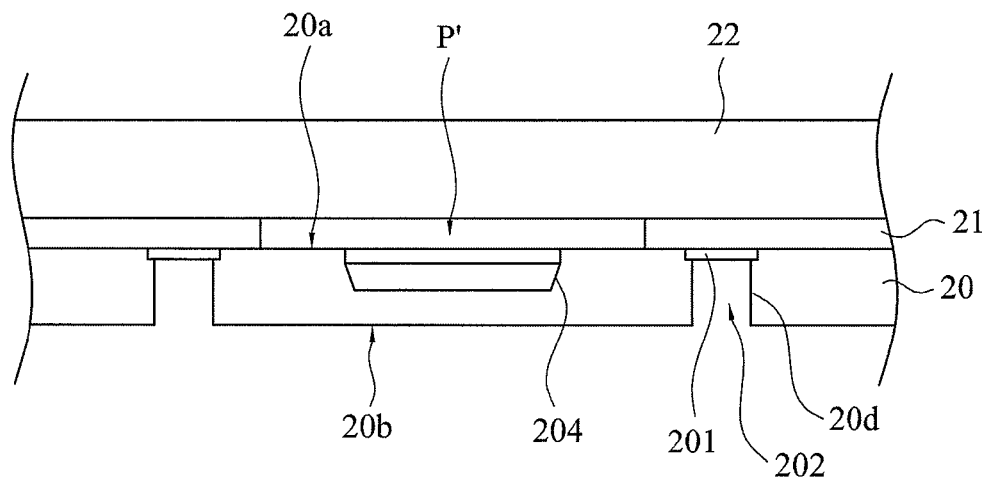
FIGS. 4A to 4D are cross-sectional views of a manufacturing method of a semiconductor package according to one embodiment of the present invention.

FIGS. 4A to 4D are cross-sectional views of a manufacturing method of a semiconductor package 4 (see FIG. 4D) according to one embodiment of the present invention. As shown in FIG. 4A, the wafer 20 that has at least one light sensor or thermal sensor 200, the first surface 20a, and the second surface 20b opposite to the first surface 20a is provided. The light sensor or the thermal sensor 200 is disposed on the first surface 20a and covers the recess 204 of the first surface 20a. The cover 22 may be disposed on the first surface 20a of the wafer 20 by at least one support 21, such that the cover 22 is above the light sensor or the thermal sensor 200, and the space P' is formed between the cover 22 and the light sensor 200 or between the cover 22 and the thermal sensor 200. Thereafter, the second surface 20b of the wafer 20 may be ground.

Figure 4B:
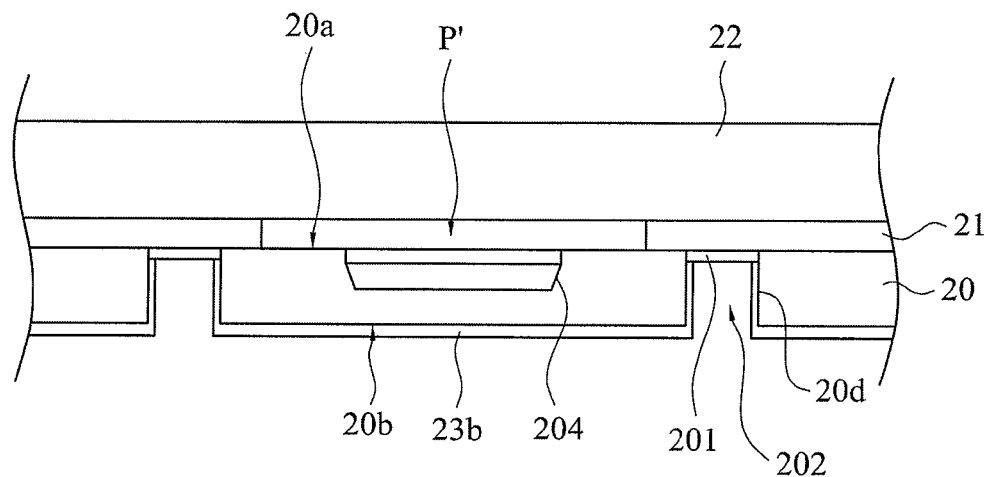

As shown in FIG. 4A and FIG. 4B, after the cover 22 covers the light sensor or the thermal sensor 200, the through hole 202 may be formed in the second surface 20b of the wafer 20 to expose the support 21 and the electrical connecting pad 201 of the wafer 20. Next, an isolation layer 23b may be formed on the second surface 20b of the wafer 20 and a wall surface 20d that surrounds the through hole 202. In this embodiment, the wall surface 20d is perpendicular to the second surface 20b and the electrical connecting pad 201. Moreover, the isolation layer 23b may be patterned to expose the electrical connecting pad 201.

Figure 4C:
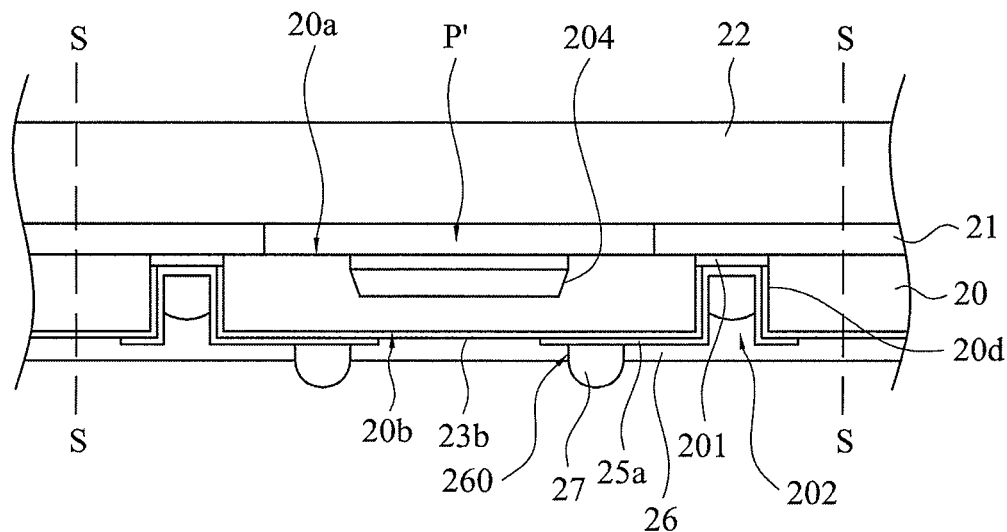

As shown in FIG. 4B and FIG. 4C, thereafter, the redistribution layer 25a may be formed on the isolation layer 23b, such that the redistribution layer 25a is electrically connected to the electrical connecting pad 201. After the redistribution layer 25a is formed, the protection layer 26 may be formed on the isolation layer 23b and the redistribution layer 25a. Afterwards, the protection layer 26 is patterned to form the opening hole 260 to expose the redistribution layer 25a. After the opening hole 260 of the protection layer 26 is formed, the conductive protrusion 27 may be formed on the redistribution layer 25a in the opening hole 260, such that the conductive protrusion 27 may be conducted with the electrical connecting pad 201 through the redistribution layer 25a, and the structure shown in FIG. 4C is obtained.

In this embodiment, a portion of the protection layer 26 is located in the through hole 202, such that a void is formed between the protection layer 26 and the electrical connecting pad 201.

Figure 4D:
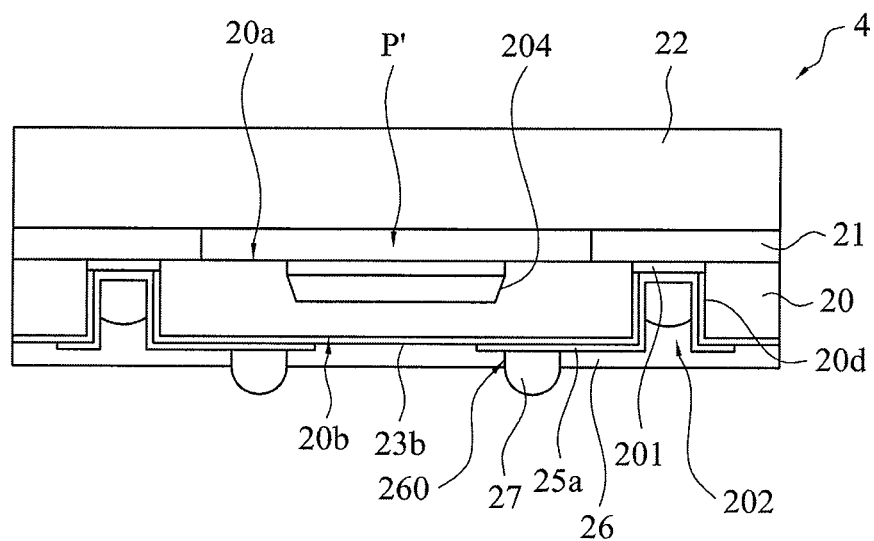

As shown in FIG. 4C and FIG. 4D, after the structure shown in FIG. 4C is obtained, the cover 22, the support 21, and the wafer 20 may be vertically diced along the cutting path S, such that the semiconductor package 4 is obtained. The substrate 20 shown in FIG. 4D is the diced wafer 20.

The semiconductor package 4 includes the substrate 20, at least one support 21, the cover 22, the isolation layer 23b, the redistribution layer 25a, the protection layer 26, and the conductive protrusion 27. The substrate 20 has at least one light sensor or thermal sensor 200, the first surface 20a and the second surface 20b that is opposite to the first surface 20a. The first surface 20a has the recess 204 and the electrical connecting pad 201. The recess 204 can prevent a light signal or a thermal signal of the light sensor 200 or a light signal or a thermal signal of the thermal sensor 200 from dissipating through the substrate 20 to affect a detecting result. The light sensor or the thermal sensor 200 is disposed on the first surface 20a and covers the recess 204. The support 21 is disposed on the first surface 20a of the substrate 20. The cover 22 is located on the support 21, such that the space P' is formed between the cover 22 and the light sensor 200 or between the cover 22 and the thermal sensor 200. The isolation layer 23b is located on the second surface 20b of the substrate 20. The redistribution layer 25a is located on the isolation layer 23b and electrically connected to the electrical connecting pad 201. The protection layer 26 is located on the isolation layer 23b and the redistribution layer 25a, and the protection layer 26 has the opening hole 260 to expose a portion of a surface of the redistribution layer 25a. The conductive protrusion 27 is located on the redistribution layer 25a that is in the opening hole 260.

In this embodiment, the substrate 20 has the wall surface 20d adjacent to the electrical connecting pad 201 and the second surface 20b, and the isolation layer 23b is located on the wall surface 20d. Furthermore, the wall surface 20d is perpendicular to the second surface 20b and the electrical connecting pad 201, and the protection layer 26 is located in the through hole 202.

Since the first surface of the substrate of the semiconductor package has the recess, the volume of the substrate of the semiconductor package may be reduced. As a result, signal noise can be decreased, and the detecting capability of the light sensor or the thermal sensor (e.g., infrared ray detecting capability) is improved. Therefore, the use of the semiconductor package is expanded and the purpose of multiple functions is achieved, thereby improving product competitiveness.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor package, comprising:
a substrate having at least one light sensor or at least one thermal sensor, a first surface, a second surface opposite to the first surface, and a sidewall that is adjacent to the first and second surfaces, wherein the at least one light sensor or the at least one thermal sensor is disposed on the first surface, wherein the first surface of the substrate has at least one electrical connecting pad that protrudes from the sidewall, wherein the second surface of the substrate has an opening to expose the at least one light sensor or the at least one thermal sensor, and wherein the sidewall faces away from the opening;

at least one support disposed on the first surface of the substrate;

a cover disposed on the at least one support, such that the cover is above the at least one light sensor or the at least one thermal sensor to form a first space between the cover and the at least one light sensor or between the cover and the at least one thermal sensor;

a plate placed on the second surface of the substrate to cover the opening, such that a second space is formed between the plate and the at least one light sensor or between the plate and the at least one thermal sensor; and an isolation layer between the second surface of the substrate and the plate, and covering the sidewall of the substrate and the at least one electrical connecting pad that protrudes from the sidewall, wherein the isolation layer does not extend beyond a top most surface of the plate adjacent the second surface of the substrate.

2. The semiconductor package of claim 1, wherein the first surface of the substrate further has a plurality of electrical connecting pads.

3. The semiconductor package of claim 2, wherein the at least one support is located on one of the electrical connecting pads.

4. The semiconductor package of claim 1, wherein the cover is made of light impermeable material.

5. The semiconductor package of claim 4, wherein the cover is made of silicon or quartz.

6. The semiconductor package of claim 1, wherein the cover is made of light permeable material.

7. The semiconductor package of claim 6, wherein the cover is made of glass.

8. The semiconductor package of claim 1, wherein the plate is made of silicon or glass.

9. The semiconductor package of claim 1, wherein the isolation layer is formed on a portion of the second surface of the substrate.

10. The semiconductor package of claim 1, wherein the plate is disposed on the isolation layer.

11. The semiconductor package of claim 1, further comprising:

a redistribution layer formed on the plate and the substrate.

12. The semiconductor package of claim 11, further comprising:

a protection layer formed on the plate and the redistribution layer, wherein the protection layer has an opening hole to expose a portion of a surface of the redistribution layer.

13. The semiconductor package of claim 12, further comprising:

a conductive protrusion formed on the redistribution layer in the opening hole.

14. A manufacturing method of a semiconductor package, comprising:

providing a wafer that has at least one light sensor or at least one thermal sensor, a first surface, a second surface opposite to the first surface, and a sidewall that is adjacent to the first and second surfaces, wherein the at least one light sensor or the at least one thermal sensor is disposed on the first surface, wherein the first surface of the substrate has at least one electrical connecting pad that protrudes from the sidewall;

disposing a cover on at least one support that is disposed on the first surface of the wafer, such that the cover is above the at least one light sensor or the at least one thermal sensor to form a first space between the cover and the at least one light sensor or between the cover and the at least one thermal sensor;

forming an opening in the second surface of the wafer to expose the at least one light sensor or the at least one thermal sensor, wherein the sidewall faces away from the opening;

placing a plate on the second surface of the substrate to cover the opening, such that a second space is formed between the plate and the at least one light sensor or between the plate and the at least one thermal sensor, wherein an isolation layer is disposed between the second surface of the wafer and the plate, covering the sidewall of the wafer and the at least one electrical connecting pad that protrudes from the sidewall, wherein the isolation layer does not extend beyond a top most surface of the plate adjacent the second surface of the wafer.

15. The manufacturing method of the semiconductor package of claim 14, wherein the first surface of the wafer further has a plurality of electrical connecting pads, and the at least one support is located on one of the electrical connecting pads.

16. The manufacturing method of the semiconductor package of claim 14, wherein when the cover is made of light impermeable material, forming the first space comprises:

forming the at least one support on the first surface of the wafer; and disposing the cover on the at least one support, such that the cover is above the at least one light sensor or the at least one thermal sensor, and the first space is formed between the cover and the at least one light sensor or between the cover and the at least one thermal sensor.

17. The manufacturing method of the semiconductor package of claim 16, wherein the cover is made of silicon or quartz.

18. The manufacturing method of the semiconductor package of claim 14, wherein when the cover is made of light permeable material, forming the first space comprises:

forming the at least one support on the cover; and disposing the at least one support on the first surface of the wafer, such that the cover is above the at least one light sensor or the at least one thermal sensor, and the first space is formed between the cover and the at least one light sensor or between the cover and the at least one thermal sensor.

19. The manufacturing method of the semiconductor package of claim 18, wherein the cover is made of glass.

20. The manufacturing method of the semiconductor package of claim 14, wherein the plate is made of silicon or glass.

21. The manufacturing method of the semiconductor package of claim 14, wherein before the opening is formed, the method further comprises:

forming an opening region that is aligned with the at least one light sensor or the at least one thermal sensor on the isolation layer to expose a portion of the second surface of the wafer; and forming the opening in the second surface of the wafer in the opening region.

22. The manufacturing method of the semiconductor package of claim 21, wherein the plate is disposed on the isolation layer.

23. The manufacturing method of the semiconductor package of claim 14, wherein the opening is formed by etching.

24. The manufacturing method of the semiconductor package of claim 14, further comprising:
- forming a through hole in the second surface of the wafer to expose the at least one support;
- disposing the plate on the through hole after the plate is placed;
- forming a via hole that is communicated with the through hole in the plate to expose the at least one support; and
- forming a redistribution layer on the plate, a sidewall of the via hole, and a sidewall of the through hole.

25. The manufacturing method of the semiconductor package of claim 24, further comprising forming a protection layer on the plate and the redistribution layer, and forming an opening hole in the protection layer to expose a portion of a surface of the redistribution layer on the plate.

26. The manufacturing method of the semiconductor package of claim 25, further comprising performing a dicing process, wherein a cutting path of the dicing process is along the through hole and the via hole.

* * * * *